United States Patent
Yang

(10) Patent No.: US 10,795,034 B2
(45) Date of Patent: Oct. 6, 2020

(54) DIGITAL X-RAY DETECTOR PANEL AND X-RAY SYSTEM INCLUDING THE SAME

(71) Applicant: LG Display Co., Ltd., Seoul (KR)

(72) Inventor: Jungyul Yang, Uijeongbu-si (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 16/216,473

(22) Filed: Dec. 11, 2018

(65) Prior Publication Data
US 2019/0196030 A1    Jun. 27, 2019

(30) Foreign Application Priority Data
Dec. 27, 2017    (KR) .................. 10-2017-0181605

(51) Int. Cl.
| | |
|---|---|
| *G01T 1/24* | (2006.01) |
| *G01N 23/04* | (2018.01) |
| *G01T 1/20* | (2006.01) |
| *H01L 27/146* | (2006.01) |

(52) U.S. Cl.
CPC ............ *G01T 1/247* (2013.01); *G01N 23/04* (2013.01); *G01T 1/2006* (2013.01); *G01T 1/244* (2013.01); *H01L 27/146* (2013.01); *H01L 27/14663* (2013.01); *G01N 2223/501* (2013.01); *G01N 2223/504* (2013.01)

(58) Field of Classification Search
CPC ........ G01T 1/247; G01T 1/2006; G01N 23/04
See application file for complete search history.

(56) References Cited

U.S. PATENT DOCUMENTS

| | | | |
|---|---|---|---|
| 2007/0096647 A1* | 5/2007 | Choo ................ | H01L 29/78669 313/512 |
| 2018/0138219 A1* | 5/2018 | Mruthyunjaya .. | H01L 27/14618 |
| 2018/0211079 A1* | 7/2018 | Liu ..................... | G06K 9/0004 |

* cited by examiner

*Primary Examiner* — Hugh Maupin
(74) *Attorney, Agent, or Firm* — Seed Intellectual Property Law Group LLP

(57) ABSTRACT

A digital X-ray detector panel and an X-ray system including the same are disclosed, which include a Gate-In-Panel (GIP) structure in which a gate driver element is embedded in the panel, reduce production costs, and are easily applied to a narrow bezel and a flexible panel. A light shielding layer including tungsten or copper having X-ray shielding characteristics is disposed in a gate driver element mounting region, minimizing X-ray damage to the gate driver element embedded in the panel. In order to prevent not only damage caused by X-rays vertically incident upon the panel, but also damage caused by X-rays incident upon the panel at an incidence angle of less than 90°, the light shielding layer extends to overlap at least a portion of the gate driver element mounting region.

9 Claims, 7 Drawing Sheets

Related Art

DIGITAL X-RAY DETECTOR PANEL AND X-RAY SYSTEM INCLUDING THE SAME

CROSS-REFERENCE TO RELATED APPLICATION(S)

This application claims the priority of Korean Patent Application No. 10-2017-0181605 filed on Dec. 27, 2017, in the Korean Intellectual Property Office, the disclosure of which is hereby incorporated by reference in its entirety.

BACKGROUND

Technical Field

The present disclosure relates to a digital X-ray detector panel, and an X-ray system including the digital X-ray detector panel and an X-ray generator provided with a light source for emitting X-rays to the panel.

Description of the Related Art

A digital X-ray detector (DXD) refers to an apparatus capable of detecting the transmission amount (e.g., transmissivity) of X-rays passing through a subject and displaying internal images of the subject on a display. With the rapid development of digital technology, a digital X-ray detector based on a thin film transistor (TFT) has recently been developed and rapidly come into medical use.

FIG. 1 shows a digital X-ray detector module 1 that includes a digital X-ray detector panel 10, a gate driver integrated circuit (IC) 20, and a readout integrated circuit (IC) 30. If X-rays are converted into visible light by a scintillator, the digital X-ray detector panel 10 allows the visible light to be converted into an electric signal by a PIN diode such that the electric signal passes through a series of signal processing steps. The gate driver IC 20 and the readout IC 30 may be connected to one side of the panel 10.

The digital X-ray detector panel 10 includes photosensitive pixels. Each photosensitive pixel includes a PIN diode configured to sense X-rays and output the sensed X-ray as a signal, and a thin film transistor (TFT) configured to transmit a detection signal output from the PIN diode in response to a gate signal.

The gate driver IC 20 may apply gate signals to the panel 10, and the readout IC 30 may read out the detection signal from the panel 20. In this case, the gate driver IC 20 is implemented as a film-type IC, is manufactured separately from the panel 10, and is attached to the digital X-ray detector panel 10 through additional modular fabrication, such that the gate driver IC 20 is driven.

However, the gate driver IC 20 unavoidably consumes high costs (i.e., money and time) in development and fabrication thereof, and has a limitation in reducing the size of a bezel of the digital X-ray detector 10 due to structural characteristics of a connection portion configured to interconnect the gate driver IC 20 and the digital X-ray detector 10.

In addition, due to attachment of the gate driver IC 20 configured separately from the panel 10, it is difficult to implement a flexible digital X-ray detector panel.

BRIEF SUMMARY

Therefore, the present disclosure has been made in view of the above problems, and it is an object of the present disclosure to provide a digital X-ray detector panel to reduce costs caused by additional modular fabrication to be performed separately from fabrication of the gate driver IC.

It is another object of the present disclosure to provide a digital X-ray detector panel to implement a narrow bezel.

It is another object of the present disclosure to provide a digital X-ray detector panel to facilitate implementation of a flexible panel.

It is another object of the present disclosure to provide a digital X-ray detector panel to minimize damage of a gate driver element affected by X-rays, and an X-ray system including the same.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

Various embodiments of the present disclosure are directed to providing a digital X-ray detector panel and an X-ray system including the same that substantially obviate one or more problems due to limitations and disadvantages of the related art.

In accordance with one aspect of the present disclosure, a digital X-ray detector panel comprises a base substrate formed to include an active region having a plurality of pixel regions, a wire region, and a gate driver element mounting region; a PIN diode disposed in the active region; a thin film transistor disposed in the active region, and connected to the PIN diode; a gate driver element disposed in the gate driver element mounting region, and configured to apply a gate signal to the thin film transistor; a gate signal wire disposed in the wire region, and configured to connect the gate driver element to the thin film transistor; a passivation layer formed to cover the active region, the wire region, and the gate driver element mounting region; and a light shielding layer disposed over the passivation layer corresponding to the gate driver element mounting region. The gate driver element mounting region may be disposed at one side or both sides of the active region. The wire region may be disposed between the gate driver element mounting region and the active region.

The embodiments of the present disclosure may use a Gate-In-Panel (GIP) structure in which a gate driver element is embedded in the panel, may reduce production costs, and may be easily applied to a narrow bezel and a flexible panel. A light shielding layer including tungsten or copper having superior X-ray shielding characteristics is disposed in a gate driver element mounting region, such that X-ray damage to the gate driver element embedded in the panel is minimized.

In order to prevent not only damage caused by X-rays being vertically incident upon the panel, but also damage caused by X-rays being incident upon the panel at an incidence angle of less than 90°, the light shielding layer extends to cover not only the gate driver element mounting region but also at least a portion of the wire region. In this case, a length of the light shielding layer extending to the wire region may be decided using the X-ray system using the following X-ray system.

In accordance with another aspect of the present disclosure, an X-ray system including a digital X-ray detector panel, and an X-ray generator provided with a light source for emitting X-rays to the digital X-ray detector panel comprises the light shielding layer formed to extend in a direction from the gate driver element mounting region to the wire region. A minimum extension length (x) of the light shielding layer extending from a boundary region between the gate driver element mounting region and the wire region is decided by a following equation 1, $$x = d \cdot \tan(90° - \theta)$$ Equation 1 where, d is a thickness of the passivation layer, and θ satisfies $$\tan^{-1}\frac{Sdd}{L},$$

wherein L is a distance from a specific point upon which X-ray emitted from the light source of the X-ray generator is vertically incident to the gate driver element mounting region, and SDD is a distance from the light source of the X-ray generator to the panel.

As described above, the X-ray system may arrange the light shielding layer in consideration of not only the X-ray incidence angle but also various relationships between the X-ray generator and the digital X-ray detector panel, such that X-ray damage to the gate driver element can be more effectively minimized.

DETAILED DESCRIPTION

Figure 1:
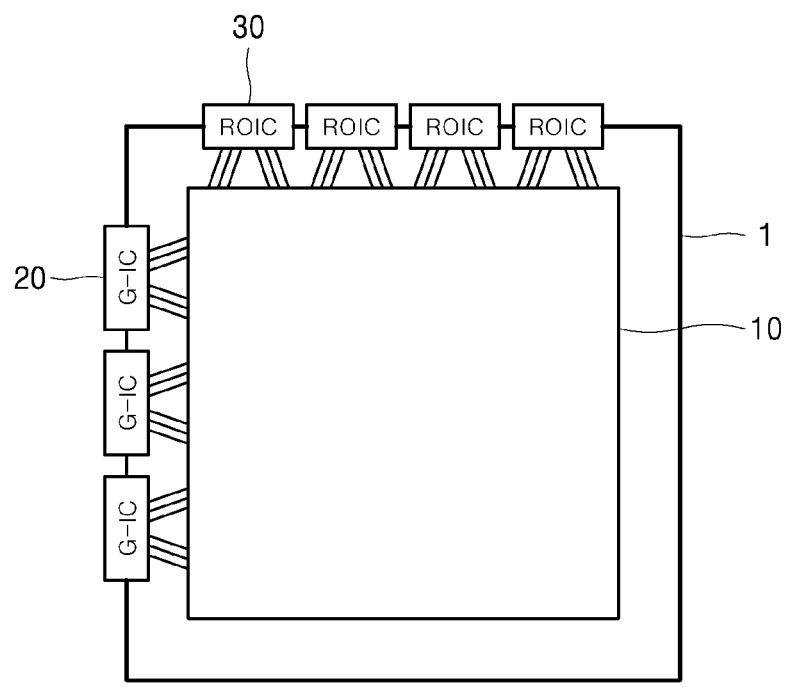
FIG. 1 is a schematic plan view illustrating a conventional digital X-ray detector module according to the related art.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that when one element is referred to as being "connected to", "coupled to", or "accessed by" another element, one element may be "connected to", "coupled to", or "accessed by" another element via a further element although one element may be directly connected to or directly accessed by another element.

Figure 2:
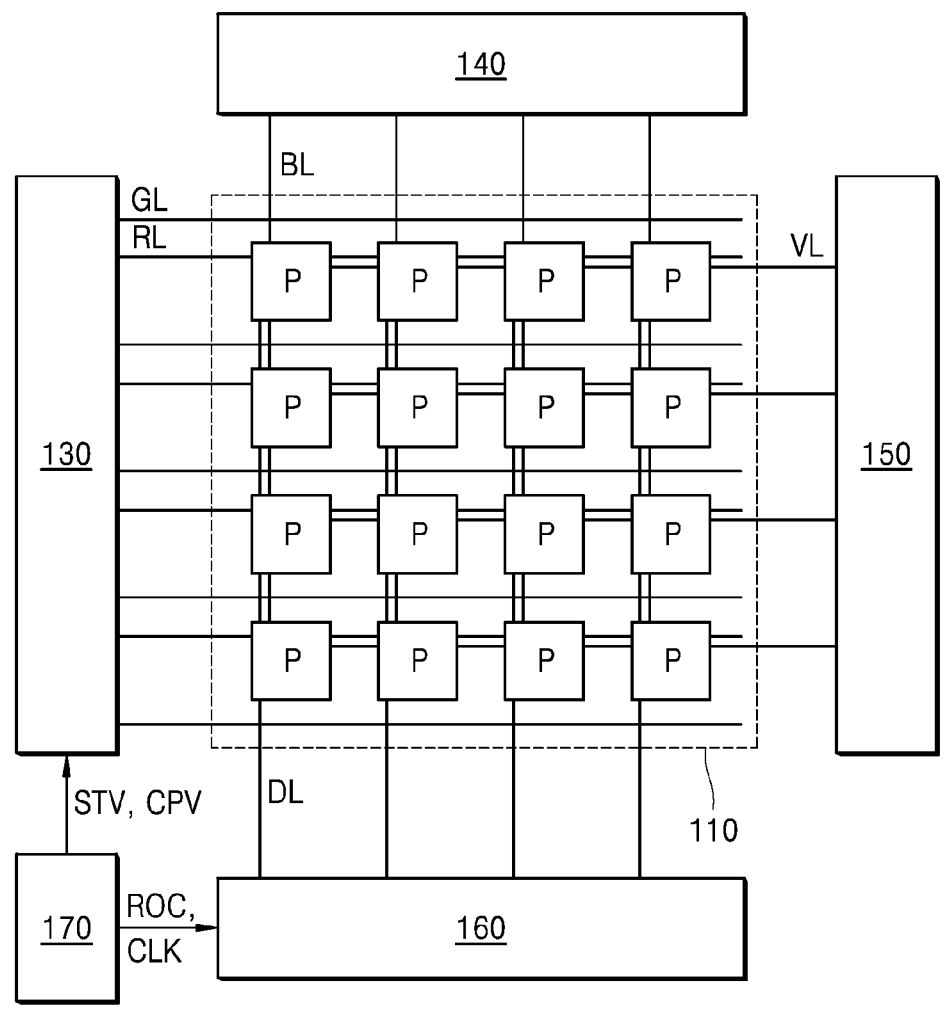
FIG. 2 is a schematic block diagram illustrating a digital X-ray detector.
Figure 3:
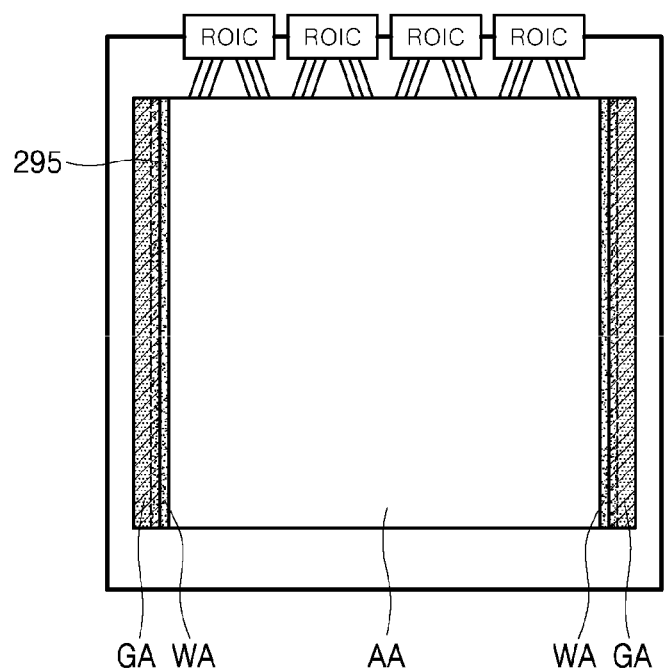
FIG. 3 is a schematic plan view illustrating a digital X-ray detector module according to an embodiment of the present disclosure.

FIG. 2 is a schematic plan view illustrating a digital X-ray detector. Referring to FIG. 2, the digital X-ray detector may include a thin film transistor (TFT) array 110, a gate driver 130, a bias supplier 140, a power-supply voltage supplier 150, a readout circuit 160, and a timing controller 170.

The TFT array 110 may sense X-rays emitted from an energy source, may perform photoelectric conversion of the sensed signal, and may thus output an electrical detection signal. In the TFT array 110, each cell region may be defined not only by a plurality of gate lines (GL) arranged in a horizontal direction, but also by a plurality of data lines (DL) arranged in a vertical direction perpendicular to the horizontal direction. Each cell region of the TFT array 110 may include a plurality of photosensitive pixels (P) arranged in a matrix.

Each photosensitive pixel (P) may include a PIN diode configured to sense light converted from X-rays and output the sensed light as a signal, and a thin film transistor (TFT) configured to transmit a detection signal output from the PIN diode in response to a gate signal. One side of the PIN diode may be connected to the thin film transistor (TFT), and the other side thereof may be connected to a bias line (BL).

A gate electrode of the thin film transistor (TFT) may be connected to the gate line (GL) through which a scan signal is transmitted, a source electrode may be connected to the PIN diode, and a drain electrode may be connected to the data line (DL) through which the detection signal is transmitted. The bias line BL may be arranged parallel to the data line (DL).

The gate driver 130 may sequentially apply a plurality of gate signals, each of which has a gate-ON voltage level, through the gate lines (GL). The gate driver 130 may also apply a plurality of reset signals, each of which has a gate-ON voltage level, through a plurality of reset lines (RL). Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 130 may be an integrated circuit (IC) such that the gate driver 130 may be populated on an external substrate connected to the TFT array 110 or may be formed over the TFT array 110 through a Gate-In-Panel (GIP) process.

The gate driver 130 may be formed over the TFT array 110 through Gate-In-Panel (GIP) processing.

The bias supplier 140 may apply a drive voltage through bias lines (BL). The bias supplier 140 may apply a predetermined voltage to the PIN diode. In this case, the bias supplier 140 may selectively apply a reverse bias or a forward bias to the PIN diode.

The power-supply voltage supplier 150 may supply a power-supply voltage to the photosensitive pixels through power-supply voltage lines (VL).

The readout circuit 160 may read out the detection signal generated from the thin film transistor (TFT) that is turned on in response to the gate signal. Accordingly, the detection signal generated from the PIN diode may be input to the readout circuit 160 through the data lines (DL).

The readout circuit 160 may include a signal detector, a multiplexer, etc. The signal detector may include a plurality of amplification circuits corresponding to the data lines (DL) on a one to one basis, and each amplification circuit may include an amplifier, a capacitor, a reset element, etc.

In order to control the gate driver 130, the timing controller 170 may generate a start signal (STV), a clock signal (CPV), etc., and may transmit the start signal (STV), the clock signal (CPV), etc., to the gate driver 130. In order to control the readout circuit 160, the timing controller 170 may generate a readout control signal (ROC), a readout clock signal (CLK), etc., and may transmit the readout control signal (ROC), the readout clock signal (CLK), etc., to the readout circuit 160.

A digital X-ray detector panel according to the present disclosure will hereinafter be described with reference to FIGS. 3 to 6.

The digital X-ray detector panel 200 according to the present disclosure may include a base substrate 211. The base substrate 211 includes an active region AA, at least one wire region WA, and at least one gate driver element mounting region GA.

The active region AA may include a PIN diode 240 disposed in each pixel region, and a thin film transistor 220 connected to the PIN diode 240. The gate driver element mounting region GA may include a gate driver element 270 for applying a gate signal to the thin film transistor 220 of the active region AA. The wire region WA may include a gate signal wire 281 for electrically interconnecting the gate driver element 270 and the thin film transistor 220, and may further include a dummy pattern 283.

The active region AA will hereinafter be described in detail. A plurality of gate lines GL and a plurality of data lines DL perpendicular to the plurality of gate lines GL may be disposed over the base substrate 210. Pixel regions (PA) may be defined by intersection regions of the gate lines GL arranged in one direction and the data lines DL arranged in the other direction perpendicular to the gate lines GL. In this case, the base substrate 211 may be formed of silicon, glass, etc. The base substrate 211 may also be formed of a flexible substrate such as polyimide, without being limited thereto.

Intersection regions of the gate lines GL arranged in one direction and the data lines DL arranged in the other direction perpendicular to the gate lines GL may include a plurality of pixel regions (PA) arranged in a matrix. Arrangement relationship of devices included in a single pixel region (PA) will hereinafter be described, and may also be equally applied to other pixel regions (PA) unless otherwise specifically stated.

A separate thin film transistor 220 may be formed for each pixel region (PA) so as to correspond to the single pixel region (PA). Therefore, a plurality of thin film transistors 220 may be disposed over the base substrate 211 defined by the plurality of pixel regions (PA). In this case, although a buffer layer, that is formed of a monolayer or multilayer structure formed of a silicon oxide (SiOx) film or silicon nitride (SiNx) film, may be disposed between the base substrate 211 and the thin film transistor 220, the buffer layer may also be omitted according to materials formed over the base substrate 211 as necessary.

In more detail, the thin film transistor 220 may be formed to include a gate electrode 221, an active layer 223, a source electrode 224a, and a drain electrode 224b.

In order to prevent reduction of the fill factor of the PIN diode 240, the thin film transistor 220 connected to the gate line GL and the data line DL may be disposed close to an intersection point of the gate line GL and the data line DL.

The fill factor refers to the ratio of the light reception region of the X-ray detector to one pixel region. In more detail, the fill factor is defined by the ratio of the region of the PIN diode 240 to one pixel region. Therefore, if the fill factor is reduced, although visible light corresponding to the reduced fill factor is emitted to the PIN diode 240, the number of electric signals to be converted is also reduced by reduction of the light reception region, such that performance or throughput of the X-ray detector is also deteriorated.

Therefore, according to one embodiment, the respective thin film transistors 220 connected to the PIN diode 230 in response to the plurality of pixel regions (PA) may be disposed close to intersection points of the gate lines GL and the data lines DL.

In more detail, the thin film transistor 220 may be disposed in the pixel region PA, and only some parts of the thin film transistor 220 may be disposed in the pixel region PA. In addition, the thin film transistor 220 may be disposed along the gate line GL or the data line DL corresponding to a boundary part of the pixel region PA, such that reduction of the fill factor of the PIN diode 240 may be minimized.

A gate electrode 221 formed of a conductive material may be disposed over the base substrate 211 corresponding to the pixel region PA. The gate electrode 221 may be formed of any one material selected from a group composed of molybdenum (Mo), aluminum (Al), chrome (Cr), gold (Au), titanium (Ti), nickel (Ni), and copper (Cu), or may be formed of alloys thereof. The gate electrode 221 may be formed of a monolayer or multilayer structure.

A gate insulation layer 222 covering the entirety of the base substrate 211 may be disposed over the gate electrode 221. The gate insulation layer 222 may be a monolayer or multilayer structure formed of a silicon oxide (SiOx) film or a silicon nitride (SiNx) film.

An active layer 223 may be disposed over the gate insulation layer 222 corresponding to the gate electrode 221. The source electrode 224a and the drain electrode 224b may respectively contact both ends of the active layer 223, and may be respectively connected to both ends of the active layer 223. In this case, the active layer 223 may be formed of an oxide semiconductor material such as indium gallium zinc oxide (IGZO), or may also be formed of a Low Temperature Polycrystalline Silicon (LTPS) material or an amorphous silicon (a-Si).

A first protective layer 230 covering the entire surface of the base substrate 211 may be disposed over the source electrode 224a and the drain electrode 224b. In the first protective layer 230, a first contact hole 231 may be formed to correspond to the source electrode 224a. A lower electrode 241 of the PIN diode 240 may be disposed over the first protective layer 230 through a first contact hole 231 allocated to each pixel region (PA), such that the lower electrode 241 may be connected to the source electrode 224a of the thin film transistor 220 through the first contact hole 231.

The PIN diode 240 may be disposed over the pixel region (PA). The lower electrode 241 of the PIN diode 240 being connected to the thin film transistor 220 through the first contact hole 231 may be formed over the first protective layer 230. The lower electrode 241 may be formed of a non-transparent metal such as molybdenum (Mo) or a transparent oxide material such as indium tin oxide (ITO), indium zinc oxide (IZO), or zinc oxide (ZnO) according to characteristics of the PIN diode 240.

The PIN layer 243 may be disposed over the lower electrode 241 of the PIN diode 240. In more detail, the PIN layer 243 in which an N-type (negative) semiconductor layer having N-type impurities, an intrinsic (I-type) semiconductor layer having no impurities, and a P-type (positive) semiconductor layer including P-type impurities are sequentially stacked, may be formed.

The intrinsic (I-type) semiconductor layer may be formed to have a larger thickness as compared to the N-type semiconductor layer and the P-type semiconductor layer. The PIN layer 243 may include a material capable of converting visible light converted from X-rays through scintillator layers 299 and 299' into an electric signal. For example, the PIN layer 233 may include amorphous selenium (a-Se), mercuric iodide (HgI2), cadmium telluride (CdTe), lead oxide (PbO), lead iodide (PbI2), bismuth triiodide (BiI3), gallium arsenide (GaAs), germanium (Ge), and the like.

An upper electrode 245 corresponding to the PIN layer 243 may be disposed over the PIN layer 243. The upper electrode 245 may be formed of a transparent conductive material such as indium tin oxide (ITO), indium zinc oxide (IZO), or zinc oxide (ZnO) so as to increase light transmission efficiency of the scintillator layer (299, 299') that receives X-rays and performs conversion of a wavelength of the X-rays.

A second protective layer 250 covering the upper electrode 245 may be disposed over the upper electrode 245. In this case, the second protective layer 250 corresponding to the upper electrode 245 may be provided with a second contact hole 251, and a bias electrode 260 may be disposed over the second protective layer 250, such that the bias electrode 260 may be connected to the upper electrode 245 of the PIN diode 240 through the second contact hole 251. A third protective layer 265 covers and is in contact with the bias electrode 260. It also covers the structure below it, including being in contact with the second protective layer 250

In the gate driver element mounting region GA, a gate driver element 270 for applying a gate signal to the thin film transistor 220 may be disposed using a Gate-In-Panel (GIP) scheme.

In this case, the gate driver mounting region GA may be disposed at one side or both sides of the active region AA. Therefore, the GIP scheme according to the present disclosure may be implemented using any of an interlacing scheme in which signals are alternately applied in the odd-even order and a double feeding scheme in which the gate signal is bidirectionally applied. If necessary, various GIP circuits such as DAC or SLC may also be applied to the present disclosure, but the scope and spirit of the present disclosure are not limited thereto.

The wire region WA may be disposed between the gate driver mounting region GA and the active region AA, and may include a gate signal wire 281 for connecting the gate driver element 270 to the thin film transistor 220. The wire region WA may include not only the gate signal wire 281 but also various wires 282 such as a ground (GND) or a bias wire, and may be changed in various ways according to various designs.

In addition, the wire region (WA) may further include a dummy pattern 283. The dummy pattern 283 may reduce static electricity that may occur in each pixel of the neighbor active region AA, and may undergo fabrication damage to one or more pixels disposed at the outermost part of the active region AA. That is, the dummy pattern 283 is not substantially driven, and may protect the active region AA. In this case, although the dummy pattern 283 can be implemented in a similar way to the PIN diode 240 or the thin film transistor 220 of the pixel, the scope and spirit of the present disclosure are not limited thereto.

The base substrate 211 of the digital X-ray detector panel 200 according to the present disclosure is defined to include the active region AA, the wire region WA, and the gate driver mounting region GA. A passivation layer 290 may be disposed over the active region AA, the wire region WA, and the gate driver element mounting region GA of the base substrate 211. The passivation layer 290 may planarize the panel 200, and may be formed of an inorganic material.

A light shielding layer 295 may be disposed over the passivation layer 290 corresponding to the gate driver element mounting region GA. The gate driver element 270 according to the present disclosure is implemented as a GIP structure embedded in the digital X-ray detector panel 200, such that there is a high possibility that the gate driver element 270 is directly exposed to X-rays. Therefore, X-ray damage to the gate driver element 270, which is embedded in the panel 200 by arranging the light shielding layer 295 having superior X-ray shielding characteristics in the gate driver element mounting region GA, can be minimized.

The light shielding layer 295 may be implemented as a film-shaped X-ray shielding film, and may be attached to the passivation layer 290 of the panel. The light shielding layer 295 may be formed of tungsten (W) or copper (Cu) having superior X-ray shielding characteristics.

In order to prevent not only damage caused by X-rays being vertically incident upon the panel, but also damage caused by X-rays being incident upon the panel at an incidence angle of less than 90°, the light shielding layer 295 may extend to cover not only the gate driver element mounting region GA but also at least a portion of the wire region WA. That is, the light shielding layer 295 may extend in the direction from the gate driver element mounting region GA to the wire region WA, such that the light shielding layer 295 may be disposed to cover at least a portion of the wire region WA. However, when the light shielding layer 295 covers the active region AA, the fill factor of the PIN diode can be reduced. Preferably, the light shielding layer 295 may maximally extend to the boundary region between the wire region WA and the active region AA.

Figure 4:
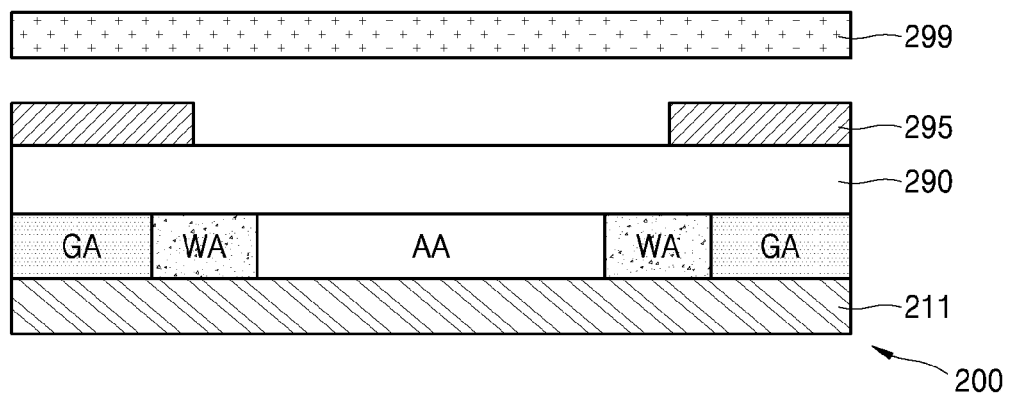
FIG. 4 is a schematic cross-sectional view illustrating a digital X-ray detector panel according to an embodiment of the present disclosure.
Figure 5:
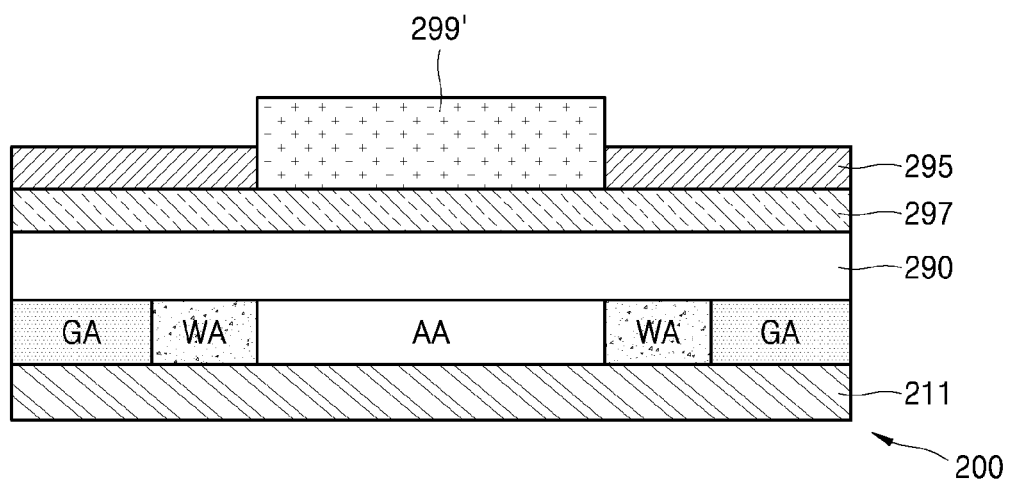
FIG. 5 is a schematic cross-sectional view illustrating a digital X-ray detector panel according to another embodiment of the present disclosure.
Figure 6:
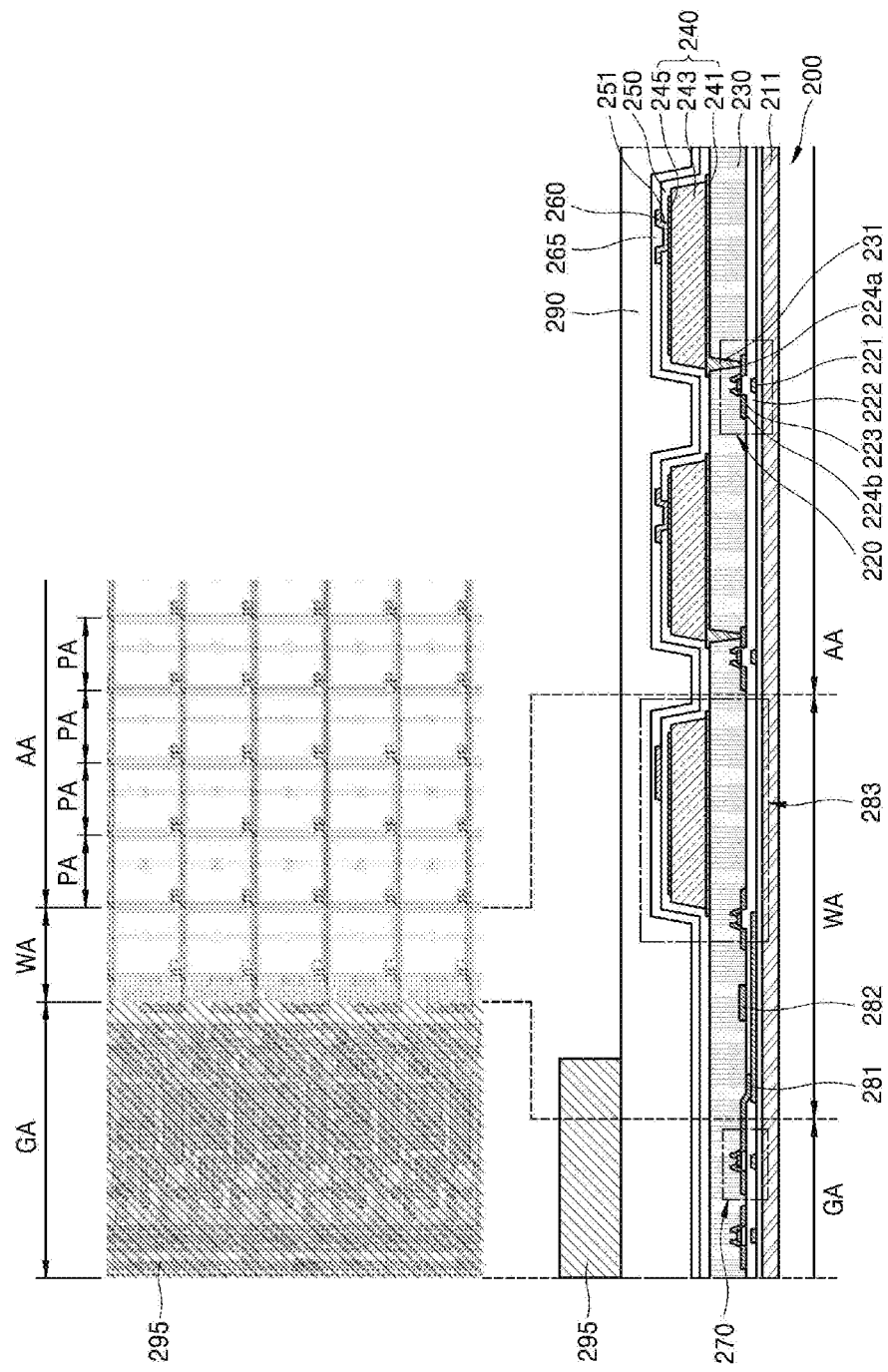
FIG. 6 illustrates a plan view and a cross-sectional view of some regions of a digital X-ray detector panel according to an embodiment of the present disclosure.
Figure 7:
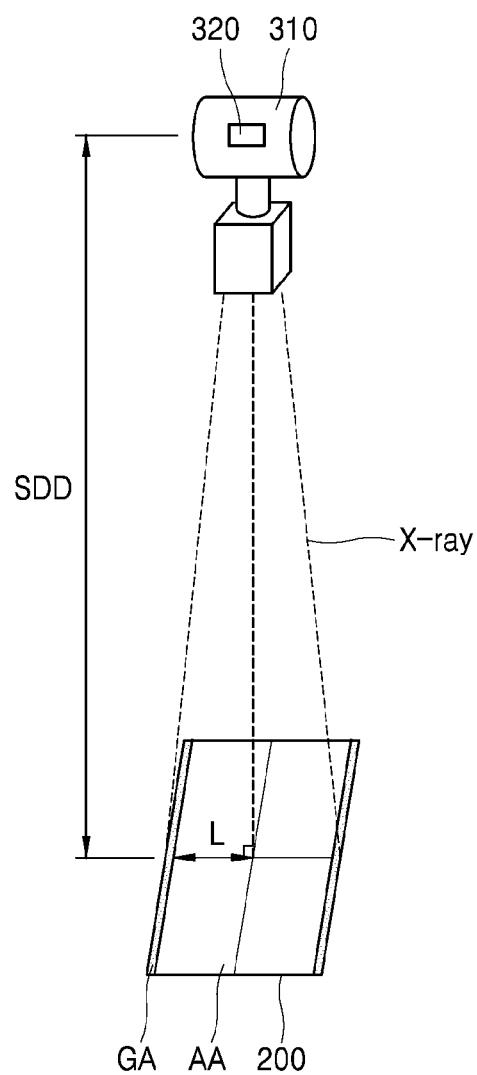
FIG. 7 is a schematic diagram illustrating an X-ray system including a digital X-ray detector panel and an X-ray generator according to an embodiment of the present disclosure.
Figure 8:
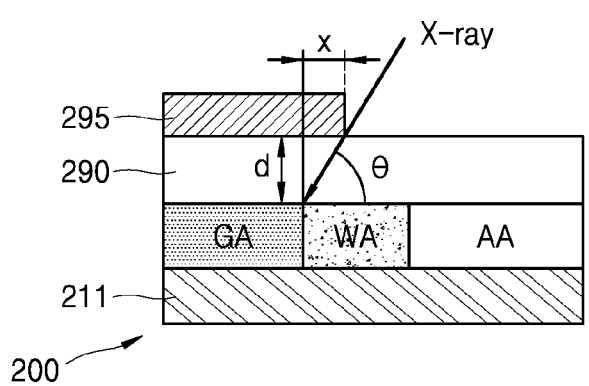
FIG. 8 is a schematic cross-sectional view illustrating some regions upon which X-rays are incident, for use in a digital X-ray detector panel according to an embodiment of the present disclosure.

The scintillator layer 299, which corresponds to the active region AA, the wire region (WA), and the gate driver element mounting region (GA), may be formed in a film shape over the light shielding layer 295, as shown in FIG. 4. The organic layer 297 may be disposed between the passivation layer 290 and the light shielding layer 295, as shown in FIG. 5. In addition, a scintillator layer 299', which is grown by depositing a plurality of scintillators over either the organic layer 297 exposed by the light shielding layer 295 or the organic layer 297 corresponding to the active region AA, may also be disposed. The scintillator layers 299 and 299' may be formed of cesium iodide (CsI).

The above-mentioned digital X-ray detector panel 200 may operate as follows.

X-rays emitted to the digital X-ray detector panel 200 may be converted into visible light by the scintillator layers 299 and 299'. The visible light may be converted into an electronic signal by the PIN layer 243 of the PIN diode 240.

In more detail, when visible light is emitted to the PIN layer 243, the intrinsic (I-type) semiconductor layer is depleted by the P-type semiconductor layer and the N-type semiconductor layer, and thus generates an electric field therein. Electrons and holes generated by light may be drifted by the electric field, and are then collected in the P-type semiconductor layer and in the N-type semiconductor layer, respectively.

The PIN diode 240 may convert visible light into an electronic signal, and may deliver the electronic signal to the thin film transistor 220. The delivered electronic signal may be displayed as an image signal after passing through the data line connected to the thin film transistor 220.

As described above, the digital X-ray detector panel 200 according to the present disclosure may include a GIP structure in which the gate driver element 270 is embedded in the panel 200, may easily implement a narrow bezel and a flexible panel, and may protect the gate driver element 270 using the light shielding layer 295 having superior X-ray shielding characteristics, such that X-ray damage can be minimized.

In order to prevent not only damage caused by X-rays vertically incident upon the panel 200, but also damage caused by X-rays incident upon the panel 200 at an incidence angle of less than 90°, the light shielding layer 295 may extend to cover not only the gate driver element mounting region GA but also at least a portion of the wire region WA, such that more effective X-ray shielding effects can be obtained.

In this case, the extension length of the light shielding layer 295, which extends from the gate driver element mounting region GA to the wire region WA and is thus disposed in the wire region WA, may be decided using the following X-ray system 300.

The X-ray system 300 according to the present disclosure may include a digital X-ray detector panel 200 and an X-ray generator 310 provided with a light source 320 for emitting X-ray to the panel 200.

In this case, the light shielding layer 295 may extend from the gate driver element mounting region GA to the wire region WA, and a minimum extension length (x) of the light shielding layer 295 extending from the boundary region between the gate driver element mounting region GA and the wire region WA may be decided by the following equation 1.

$$x = d \cdot \tan(90-\theta) \quad \text{Equation 1}$$

In Equation 1, d is a thickness of the passivation layer 290, and θ satisfies $$\tan^{-1}\frac{Sdd}{L}.$$

In addition, L is a distance from a specific point upon which X-ray emitted from the light source 320 of the X-ray generator 310 is vertically incident to the gate driver element mounting region GA, and SDD is a distance from the light source 320 of the X-ray generator 310 to the panel 200.

Generally, X-rays emitted from the X-ray light source 320 may be vertically incident upon the center part of the digital X-ray detector panel 200. As the position of X-rays incident upon the panel 200 gradually moves close to the outer surface of the panel 200, the X-ray incidence angle moves lower than 90°. Therefore, in order to effectively shield X-rays incident upon the panel 200 at a lower incidence angle, the light shielding layer 295 may extend to some regions of the wire region WA.

Specifically, the present disclosure may decide the most optimum minimum extension length of the light shielding layer 295 using Equation 1, such that X-ray shielding effects can be maximized.

The light source 320 of the X-ray generator 310 may form a vertical axis on the basis of the side of the panel 200 as necessary. Even in this case, the minimum extension length of the light shielding layer 295 may be determined in advance using Equation 1.

For example, when the length L from a specific point upon which X-rays emitted from the light source 320 of the X-ray generator 310 are vertically incident to the gate driver element mounting region GA is first measured, and the distance SDD from the light source 320 to the panel 200 is then measured, the incidence angle θ of X-rays incident upon the gate driver element mounting region GA may be calculated using the equation $$\tan^{-1}\frac{Sdd}{L}.$$

Subsequently, a thickness (d) of the passivation layer 290 and the incidence angle θ are measured, such that a minimum extension length (x) of the light shielding layer 295 to be allocated to the wire region WA can be calculated using Equation 1 "x=d·tan(90−θ)".

The X-ray system 300 according to the present disclosure may arrange the light shielding layer 295 in consideration of not only X-ray incidence angle but also various relationships between the X-ray generator 310 and the digital X-ray detector panel 200, such that X-ray damage to the gate driver element 270 can be more effectively minimized.

As is apparent from the above description, the embodiments of the present disclosure may allow the gate driver element to be GIP-embedded in the digital X-ray detector panel, thereby facilitating implementation of a narrow bezel and a flexible panel.

The embodiments of the present disclosure may allow the gate driver element to be GIP-embedded in the digital X-ray detector panel, such that there is no need to fabricate and modularize a separate gate driver IC, resulting in reduction in production costs.

The embodiments of the present disclosure may protect the gate driver element using the light shielding layer formed of a material having superior X-ray shielding characteristics, and may minimize X-ray damage to the gate driver element embedded in the panel.

The embodiments of the present disclosure may adjust the length of the light shielding layer disposed in the wire region using the X-ray system in which not only an X-ray incidence angle, but also various relationships between the X-ray generator and the digital X-ray detector panel are considered, such that X-ray damage to the gate driver element can be more effectively minimized.

The present disclosure described above may be variously substituted, altered, and modified by those skilled in the art to which the present disclosure pertains without departing from the scope and spirit of the present disclosure. Therefore, the present disclosure is not limited to the above-mentioned exemplary embodiments and the accompanying drawings.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A digital X-ray detector panel, comprising:
   a base substrate that includes an active region having a plurality of pixel regions, a wire region, and a gate driver element mounting region;
   a PIN diode disposed in the active region;
   a thin film transistor disposed in the active region and connected to the PIN diode;
   a gate driver element disposed in the gate driver element mounting region and configured to generate a gate signal;
   a gate signal wire disposed in the wire region, and configured to connect the gate driver element to the thin film transistor;
   a passivation layer formed to cover the active region, the wire region, and the gate driver element mounting region; and
   a light shielding layer disposed over the passivation layer and overlapping at least part of the gate driver element mounting region.

2. The digital X-ray detector panel of claim 1, wherein:
   the gate driver element mounting region is disposed on at least one side of the active region, and
   the wire region is disposed between the gate driver element mounting region and the active region.

3. The digital X-ray detector panel of claim 1, wherein:
   the light shielding layer covers at least a portion of the wire region.

4. The digital X-ray detector panel of claim 1, wherein the light shielding layer includes tungsten (W) or copper (Cu).

5. The digital X-ray detector panel of claim 1, wherein the wire region includes a dummy pattern.

6. The digital X-ray detector panel of claim 1, further comprising:
   a scintillator layer disposed over the light shielding layer, wherein the scintillator layer extends over the active region, the wire region, and the gate driver element mounting region.

7. The digital X-ray detector panel of claim 1, further comprising:
   an organic layer disposed between the passivation layer and the light shielding layer; and
   a scintillator layer disposed over the organic layer, the scintillator layer extending over the active region.

8. An X-ray system, comprising:
   a digital X-ray detector panel, including:
      a base substrate that includes an active region having a plurality of pixel regions, a wire region, and a gate driver element mounting region;
      a PIN diode disposed in the active region;
      a thin film transistor disposed in the active region and connected to the PIN diode;
      a gate driver element disposed in the gate driver element mounting region and configured to generate a gate signal;
      a gate signal wire disposed in the wire region and that connects the gate driver element to the thin film transistor;
      a passivation layer formed to cover the active region, the wire region, and the gate driver element mounting region; and
      a light shielding layer disposed over the passivation layer and extending to overlap at least part of the gate driver element mounting region; and
   an X-ray generator provided with a light source for emitting X-rays to the digital X-ray detector panel.

9. The X-ray system of claim 8, wherein:
   the light shielding layer extends to overlap at least part of the wire region, and
   a minimum extension length of the light shielding layer extending from a boundary region between the gate driver element mounting region and the wire region satisfies a relationship:

$$x = d \cdot \tan(90° - \theta)$$

in which x is the minimum extension length, d is a thickness of the passivation layer, and $\theta$ is equal to $$\tan^{-1} \frac{Sdd}{L},$$

L being a distance from a specific point upon which an X-ray emitted from the light source of the X-ray generator is vertically incident to the gate driver element mounting region, and Sdd being a distance from the light source of the X-ray generator to the digital X-ray detector panel.

* * * * *